United States Patent

Suematsu et al.

[11] Patent Number: 5,151,664
[45] Date of Patent: Sep. 29, 1992

[54] LOW-DISTORTION RADIO-FREQUENCY AMPLIFYING APPARATUS

[75] Inventors: Noriharu Suematsu; Tadashi Takagi; Shuji Urasaki, all of Kamakura, Japan

[73] Assignee: Mitsubishi Denki Kabushiki Kaisha, Tokyo, Japan

[21] Appl. No.: 633,950

[22] Filed: Dec. 26, 1990

[30] Foreign Application Priority Data

Dec. 27, 1989 [JP] Japan ................... 1-341052

[51] Int. Cl.⁵ .............................. H03F 1/26
[52] U.S. Cl. ............................. 330/149; 330/284; 330/144; 330/136; 455/63; 307/529; 328/162
[58] Field of Search ............ 330/149, 144, 145, 136, 330/284, 298, 129, 285, 279; 328/162; 455/126, 63, 127

[56] References Cited

U.S. PATENT DOCUMENTS

| | | | |
|---|---|---|---|
| 4,329,655 | 5/1982 | Nojima et al. | 330/149 |
| 4,331,928 | 5/1982 | Heidt | 330/149 |
| 4,570,127 | 2/1986 | Tanimoto et al. | 330/279 |
| 4,574,248 | 3/1986 | Snodgrass | 330/136 |
| 4,879,519 | 11/1989 | Myer | 330/149 |

FOREIGN PATENT DOCUMENTS

| | | |
|---|---|---|
| 0040127 | 11/1981 | European Pat. Off. . |
| 0132760 | 2/1985 | European Pat. Off. . |
| 2148640 | 11/1979 | Fed. Rep. of Germany ...... 330/129 |
| 2517494 | 11/1981 | France . |
| 60-171831 | 9/1985 | Japan ................... 455/63 |
| 61-187424 | 8/1986 | Japan ................... 455/63 |
| 1-314006 | 12/1989 | Japan . |
| 2-131606 | 5/1990 | Japan ................... 330/149 |

OTHER PUBLICATIONS

Copy of European Search Report—Communication—Oct. 18, 1991.
Japanese Patent Publication No. 52-5240 (English translation of Abstract) Jan. 14, 1977.
English translation of "A Predistortion Type Equi-Path Linearizer in Ku-Band", presented at EICIN Connection, 1990.
"19th European Microwave Conference Proceedings", pp. 706-712, 4-7, Sep. 1989.
"A Predistortion Type Equi-Path Linearizer in Ku-Band", Spring in 1990.

*Primary Examiner*—Eugene R. LaRoche
*Assistant Examiner*—Tan Dinh
*Attorney, Agent, or Firm*—Birch, Stewart, Kolasch & Birch

[57] ABSTRACT

A low-distortion radio-frequency amplifying apparatus is equipped with a distortion compensating circuit for generating a distortion signal which cancels a distortion generated during radio-frequency amplification. The apparatus detects a signal corresponding to an envelope power of the output or input of an amplifier, varies a distortion compensating characteristic according to the power value, and compensates a distortion over a wide dynamic range. The apparatus includes a detector for detecting an envelope detection signal of the amplifier, and a controller for compensating the distortion compensating characteristic according to the detected signal.

7 Claims, 5 Drawing Sheets

LOW-DISTORTION RADIO-FREQUENCY AMPLIFYING APPARATUS

BACKGROUND OF THE INVENTION

1. Field of the Invention

This invention relates to a low-distortion radio-frequency (including microwave and millimeterwave frequencies) amplifying apparatus equipped with a distortion compensating circuit for compensating a distortion generated due to the non-linearity of input and output characteristics of a radio-frequency amplifier.

2. Description of the Related Art

FIG. 7 of the accompanying drawings shows a conventional low-distortion radio-frequency amplifying circuit disclosed in, for example, Japanese Patent Laid-Open Publication No. 5240/1977. In FIG. 7, reference numeral 1 designates an input terminal; 2, an output terminal; 10, a distortion compensating circuit; and 40, a solid state power amplifier. The distortion compensating circuit 10 includes a divider 12 for distributing an input signal to each of three receiving elements, a distortion generating amplifier 20, linear amplifiers 21, 22, variable attenuators 25a, 25b, 25c, 25d, a distortion extracting combiner 30 for combining the output of the distortion generating amplifier 20 and the output of the linear amplifier 21 in opposite phases to extract a distortion, and a combiner 31 for combining the distortion component extracted by the distortion extracting combiner 30 and the output of the linear amplifier 22 in opposite phases.

In operation, an input signal inputted to the input terminal 1 is divided into the three amplifiers 20, 21, 22 by the divider 12. A first output of the divider 12 is introduced to the distortion generating amplifier 20. The signal, with a distortion component, amplified by the distortion generating amplifier 20 is introduced to the distortion extracting combiner 30.

A second output of the divider 12 is introduced to the linear amplifier 21 via the variable attenuator 25b and is thereby amplified without generating a distortion component, whereupon this amplified output is introduced to the distortion extracting combiner 30. In the distortion extracting combiner 30, the output of the distortion generating amplifier 20, which output contains a distortion component, is combined with the output of the linear amplifier 21, which output contains no distortion component, in opposite phases. Thus only the distortion component of the output of the distortion generating amplifier 20 is extracted, and this extracted output is introduced to the combiner 31 via the variable attenuator 25c. When extracting a distortion, the amount of attenuation of the variable attenuator 25a is set in such a manner that the amplitudes of the two signal components to be combined would be equal.

A third output of the divider 12 is introduced to the linear amplifier 22 via the variable attenuator 25d and is thereby amplified without containing a distortion component, whereupon this amplified output is introduced to the combiner 31.

In the combiner 31, the output of the distortion extracting combiner 30, which output is attenuated by the variable attenuator 25c, is combined with the output of the linear amplifier 22 in opposite phases.

The output of the distortion compensating circuit 10 is inputted to the solid state power amplifier 40 where amplification is performed so as to cancel a distortion component generated in the solid state power amplifier 40. This resulting output is outputted to the output terminal 2.

Therefore, for compensating a distortion, the amount of distortion generated in the distortion generating amplifier 20 of the distortion compensating circuit 10 must normally be equal to the amount of distortion generated in the solid state power amplifier 40, irrespective of the output power of the solid state power amplifier 40.

FIG. 8 of the accompanying drawings is a graph showing the output power dependency of a 3rd intermodulation distortion contained in the output of the solid state power amplifier 40. In this graph, a solid line represents a characteristic in the presence of the solid state power amplifier 40 alone, and a dotted line represents a characteristic when the solid state power amplifier 40 is equipped with the distortion compensating circuit 10. As is apparent from FIG. 8, the distortion near a particular output power can be compensated, but it is difficult to compensate a distortion over a wide dynamic range. This is because the amount of distortion generated in the distortion generating amplifier 20 cannot be equal to the amount of distortion generated in the solid state power amplifier 40 over a wide dynamic range.

With this conventional low-distortion radio-frequency amplifying ciruit, it is difficult to compensate a distortion generated in the solid state power amplifier over a wide dynamic range.

SUMMARY OF THE INVENTION

It is therefore an object of this invention to provide a low-distortion radio-frequency amplifying apparatus equipped with a distortion compensating circuit which can compensate a distortion generated in the solid state power amplifier over a wide dynamic range.

According to a first aspect of the invention, there is provided a low-distortion radio-frequency amplifying apparatus equipped with a distortion compensating circuit for compensating a distortion generated due to a non-linearity of input and output characteristics of a radio-frequency amplifier, the apparatus including: a detector for detecting an envelope level of the input or output of the radio-frequency amplifier; and a control means for varying a distortion compensating characteristic of a distortion compensating circuit according to the detected envelope level.

According to the second aspect of the invention, there is provided a low-distortion radio-frequency amplifying apparatus equipped with a distortion compensating circuit for compensating a distortion generated to a non-linearity of input and output characteristics of a radio-frequency amplifier, the apparatus including: a detector for detecting an average power of the input or output of the radio-frequency amplifier or a signal corresponding to the average power; and a controller for varying the distortion compensating characteristic of the distortion compensating circuit according to the detected average power.

With the first arrangement of the invention, since the distortion compensating circuit is controlled to an optimum by the envelope level of the input or output of the amplifier whose distortion is to be compensated, or by a signal corresponding to the envelope detection output, it is possible to compensate a distortion generated in the amplifier over a wide dynamic range.

With the second arrangement of the invention, since the distortion compensating circuit is controlled to an optimum by the average power of the input or output of the amplifier whose distortion is to be compensated, or by a signal corresponding to the average power, it is possible to compensate a distortion generated in the amplifier over a wide dynamic range.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitative of the present invention and wherein.

DETAILED DESCRIPTION

Figure 1:
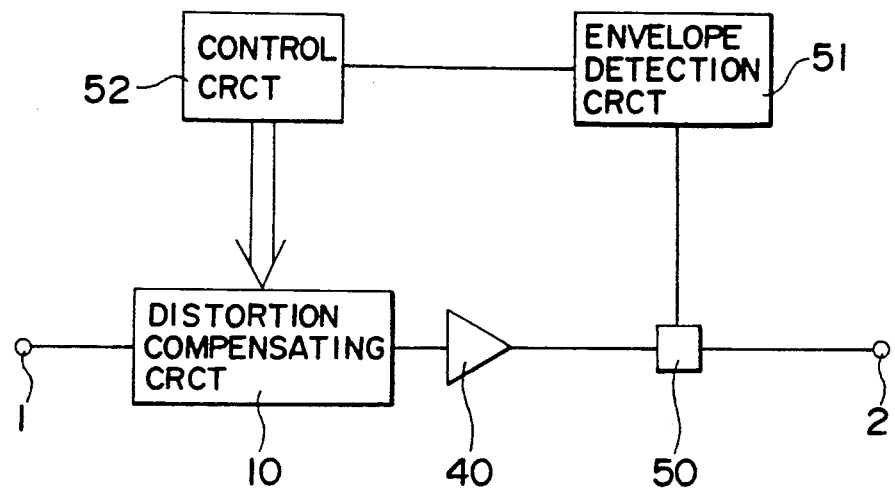
FIG. 1 is a circuit diagram showing a low-distortion radio-frequency amplifying apparatus according to a first embodiment of this invention.

The principles of this invention are particularly useful when embodied in a low-distortion radio-frequency amplifying apparatus such as shown in FIG. 1.

In FIG. 1, reference numeral 1 designates an input terminal; 2, an output terminal; 10, a distortion compensating circuit; 40, a solid state power amplifier whose distortion is to be compensated; 50, a directional coupler; 51, an envelope detecting circuit; and 52, a control circuit for controlling the distortion compensating circuit 10.

In operation, after a distortion component has been added to an input signal by the distortion compensating circuit 10, the input signal inputted to the input terminal 1 is inputtted to the solid state power amplifier 40 where amplification is performed so as to cancel a distortion generated in the distortion compensating circuit 10. This resulting output is outputted to the output terminal 2. A part of the output of the solid state power amplifier 40 is taken out by the directional coupler 50 and is envelope-detected by the envelope detecting circuit 51. This detection output is introduced to the control circuit 52 to control the distortion compensating circuit 10. As described below, setting of the characteristic of the distortion compensating circuit 10 is controlled to an optimum according to the envelope detection output.

Figure 2:
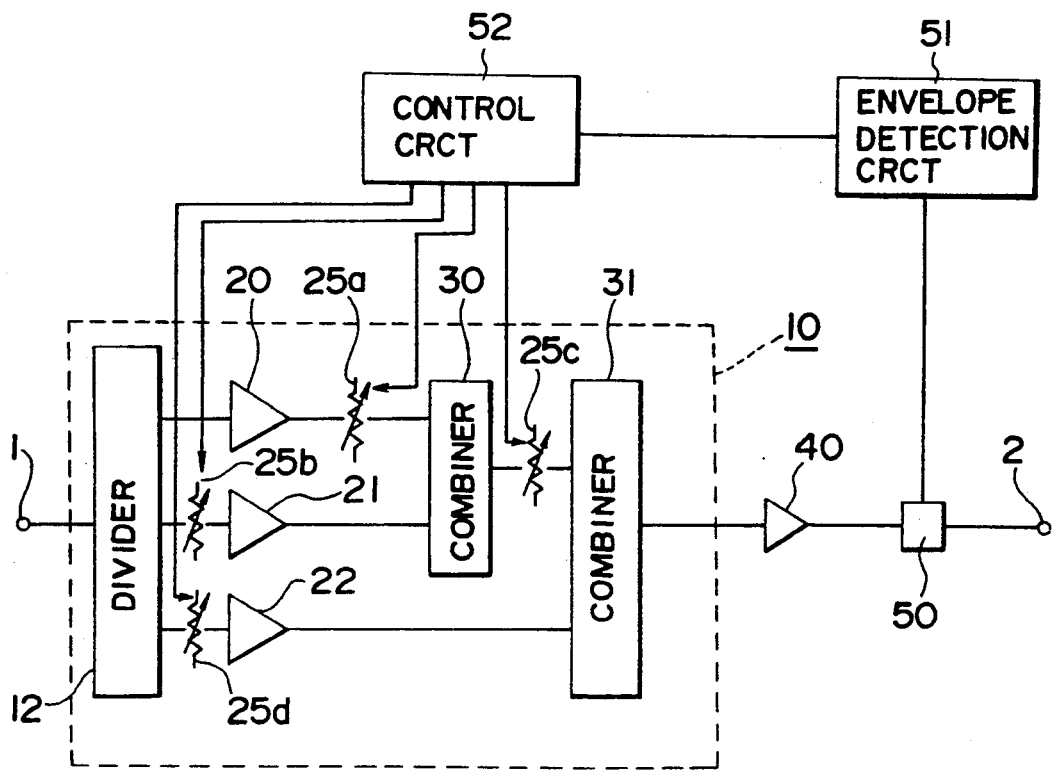
FIG. 2 is a detailed circuit diagram of FIG. 1.

In FIG. 2, reference numeral 1 designates an input terminal; 2, an output terminal; 10 a distortion compensating circuit; 40, a solid state power amplifier; 50, a directional coupler; 51, an envelope detecting circuit; and 52, a control circuit for controlling the distortion compensating circuit 10. The distortion compensating circuit 10 includes a divider 12 for distributing an input signal to each of three receiving elements, a distortion generating amplifier 20, linear amplifiers 21, 22, variable attenuators 25a, 25b, 25c, 25d, a distortion extracting combiner 30 for combining the output of the distortion generating amplifier 20 with the output of the linear amplifier 21 in opposite phases to extract a distortion, and a combiner 31 for combining the distortion component, which is extracted by the distortion extracting combiner 30, with the output of the linear amplifier 22 in opposite phases.

The control circuit 52 controls the amount of attenuation of each of the variable attenuators 25a, 25b, 25c, 25d in such a manner that the characteristic of the distortion compensating circuit 10 is set to an optimum according to the envelope detection output.

Figure 3:
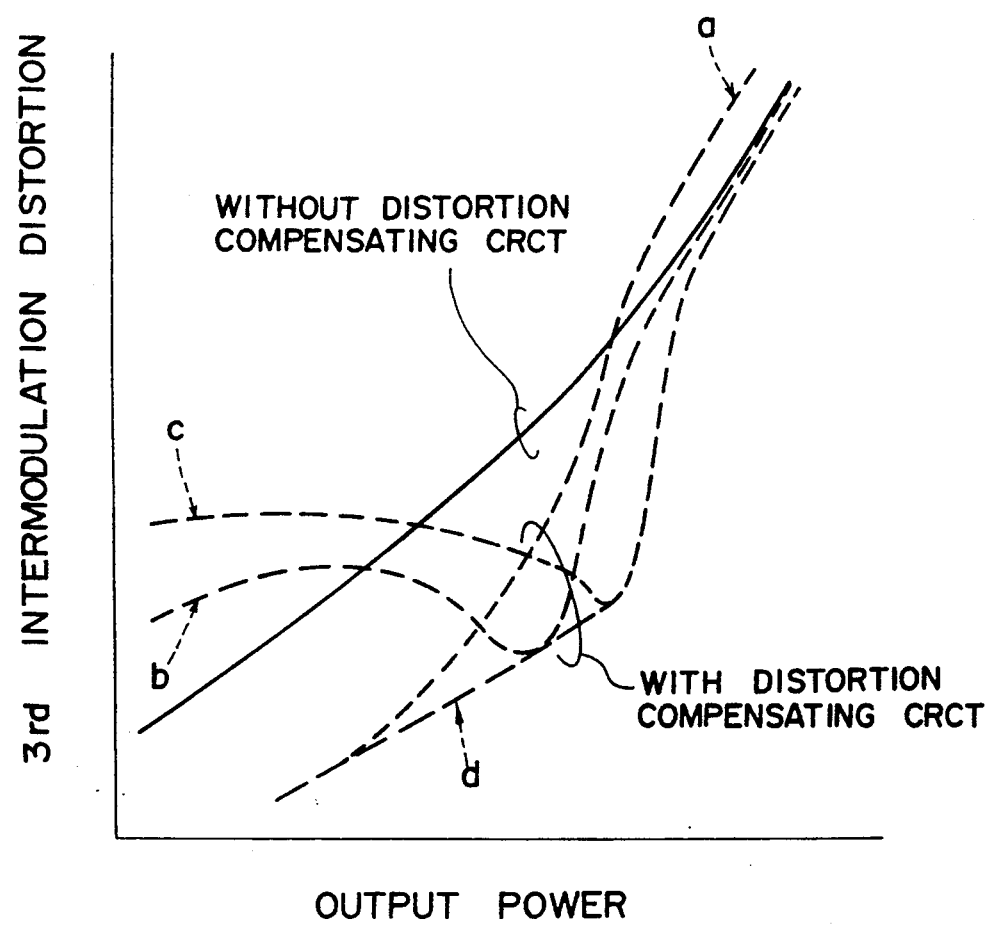
FIG. 3 is a characteristic graph showing the output power dependency of a third intermodulation distortion generated in the low-distortion radio-frequency amplifying apparatus of FIG. 1.

FIG. 3 is a characteristic graph showing the output power dependency of a third intermodulation distortion contained in the output of the solid state power amplifier 40. In FIG. 3, a solid line represents a characteristic in the presence of the solid state power amplifier 40 alone, and dotted lines represent characteristics when the distortion compensating circuit 10 is equipped with the solid state power amplifier 40. By varying the setting of characteristic of the distortion compensating circuit 10, it is possible to vary the characteristic of the low-distortion radio-frequency amplifying apparatus as indicated by the dotted lines a, b, c. Therefore, as its characteristic setting is varied according to the output power, the distortion compensating circuit can compensate a distortion generated in the solid state power amplifier. Here in this illustrated embodiment, controlling of the distortion compensating circuit is performed by the envelope level of the output of the solid state power amplifier 40. The characteristic at the moment is indicated by the thick dotted line d in FIG. 3, indicating that a distortion can be compensated over a wide dynamic range.

Figure 4:
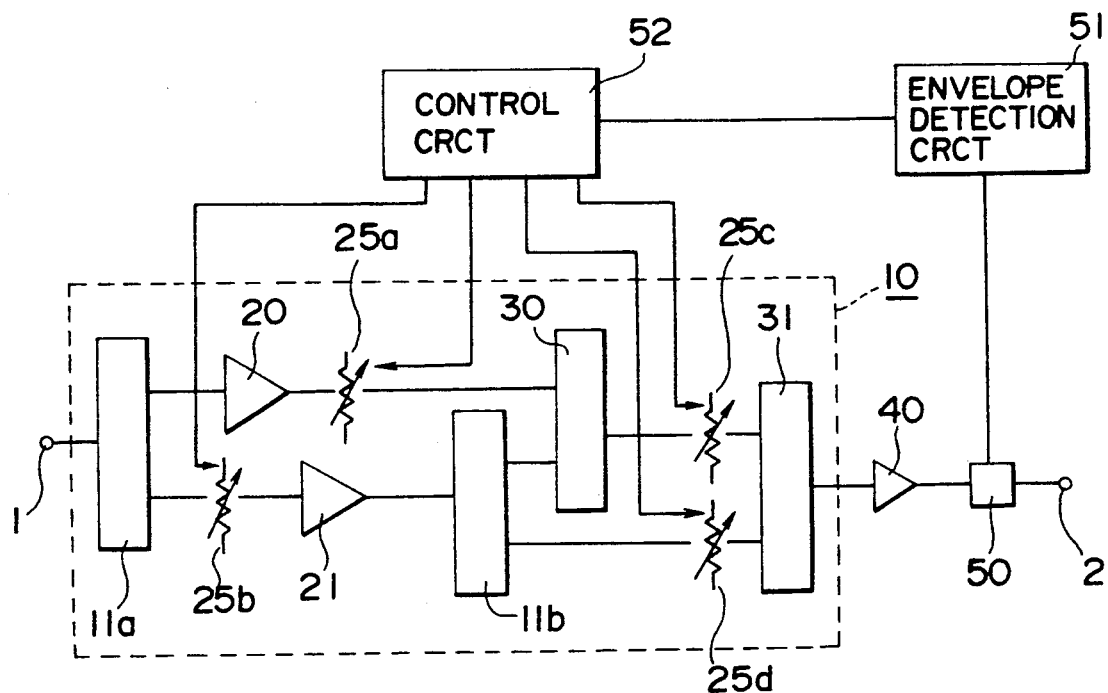
FIGS. 4, 5 and 6 are circuit diagrams respectively showing low-distortion radio-frequency amplifying apparatuses according to various different embodiments.

FIG. 4 shows another embodiment in which a different distortion compensating circuit is controlled. In FIG. 4, reference numeral 1 designates an input terminal; 2, an output terminal; 10, a distortion compensating circuit; 40, a solid state power amplifier; 50, a directional coupler; 51, an envelope detecting circuit; and 52, a control circuit for controlling the distortion compensating circuit 10. The distortion compensating circuit 10 includes dividers 11a, 11b each for distributing an input signal to two receiving elements, a distortion generating amplifier 20, a linear amplifier 21, variable attenuators 25a, 25b, 25c, 25d, a distortion extracting combiner 30 for combining the distortion generating amplifier output 20 and the output of the linear amplifier 21 in opposite phases to extract a distortion, and a combiner 31 for combining the distortion component, which is extracted by the distortion extracting combiner 30, with the output of the linear amplifier 22 in opposite phases. By varying the amount of attenuation of each of the variable attenuators 25a, 25b, 25c, 25d according to the envelope detection output by the control circuit 52, it is possible to compensate a distortion generated in the solid state power amplifier 40 over a wide dynamic range by the distortion compensating circuit 10.

The distortion compensating circuit 10 may be controlled continuously according to the output power of the solid state power amplifier 40 or may be controlled as switch for each power range.

In this embodiment, the distortion compensating circuit 10 is controlled by the envelope detection output of the output of the solid state power amplifier 40. Alternatively, the distortion compensating circuit 10 may be controlled by the envelope detection output of the solid state power amplifier 40.

Figure 5:
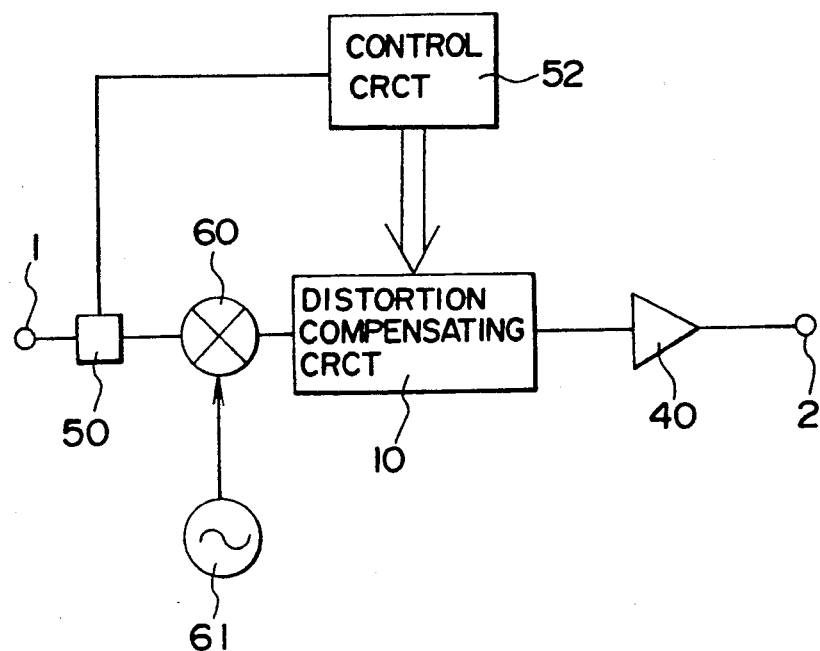

Further, the distortion compensating circuit 10 may be controlled by a signal corresponding to the envelope detection output of the input or output of the solid state power amplifier 40, as shown in FIG. 5. In FIG. 5, reference numeral 60 designates a mixer; and 61, an RF signal source. A base band signal inputted to the input terminal 1 is converted in frequency by the mixer 60, using the RF signal source 61 as a local frequency signal. The modulated signal is passed through the distortion compensating circuit 10, is amplified by the solid state power amplifier 40 and is outputted to the output terminal 2. The base band signal inputted to the input terminal 1 corresponds to the envelope detection output of the input of the solid state power amplifier 40; a part of this base band signal is inputted to the control circuit 52 of the distortion compensating circuit 10 to control the distortion compensating circuit 10.

Figure 6:
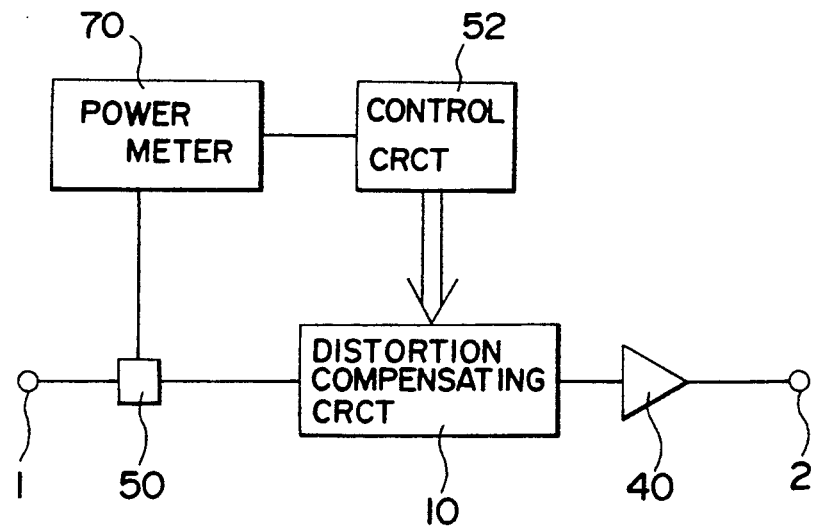
Figure 7:
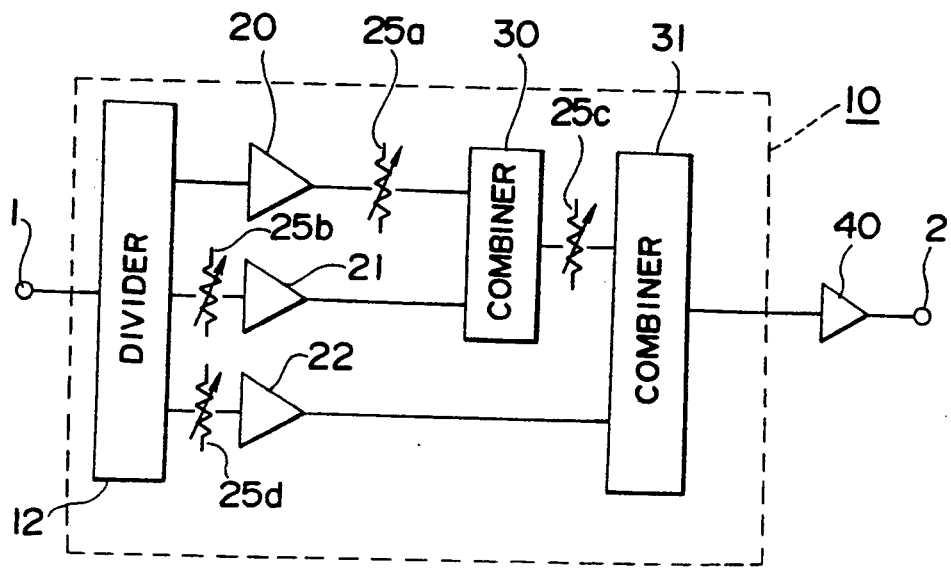
FIG. 7 is a circuit diagram showing a conventional low-distortion radio-frequency amplifying circuit.
Figure 8:
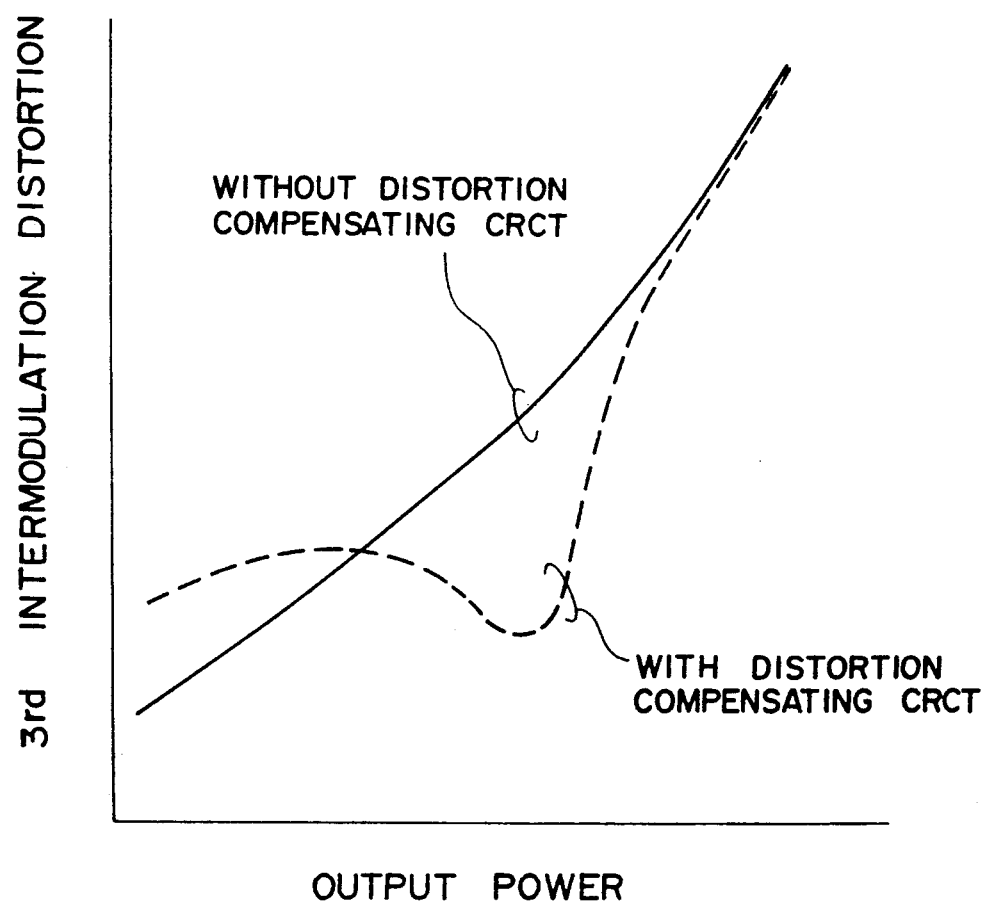
FIG. 8 is a characteristic graph showing the output electric dependency of a third intermodulation distortion generated in the conventional low-distortion radio-frequency amplifying circuit of FIG. 7.

In this embodiment, the distortion compensating circuit is controlled by the envelope detection output of the input or output of the solid state power amplifier 40. If the power of the input at terminal 1 or the input of the solid state power amplifier 40 fluctuates gently with respect to time, the distortion compensating circuit may be controlled by an average power, as shown in FIG. 6. In FIG. 6, reference numeral 70 designates a power meter. A part of the signal inputted to in the input terminal 1 and taken out by the directional coupler 50 is inputted to the power meter 70, and then the power meter 70 generates a signal proportional to the average power. According to this resulting signal, the control circuit 52 controls the distortion compensating circuit 10. Further, instead of using the directly measured average power, the distortion compensating circuit may be controlled by a signal corresponding to an average power. For example, if the frequency of carriers for input to the amplifier is proportional to an average power, the distortion compensating circuit may be controlled based on the information concerning the frequency of carriers from the external (e.g., a modulator) of the apparatus.

As mentioned above, according to the first arrangement of this invention, the distortion compensating circuit is controlled by the envelope level of the input or output of the amplifier whose distortion is to be compensated or by a signal corresponding to the envelope detection output in such a manner that the characteristic of the distortion compensating circuit can be set to an optimum. Therefor, it is possible to compensate a distortion generated in the amplifier over a wide dynamic range, thus guaranteeing an improved low-distortion radio-frequency amplifying apparatus.

According to the second arrangement of the invention, since the distortion compensating circuit is controlled by an average power of the input or output of the amplifier whose distortion is to be compensated or by a signal corresponding to the average power in such a manner that the characteristic of the distortion compensating circuit can be set to an optimum, it is also possible to compensate a distortion generated in the amplifier over a wide dynamic range, thus guaranteeing an improved low-distortion radio-frequency amplifying apparatus.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A distortion compensating circuit for a radio frequency amplifier, comprising:

distortion compensating means coupled to an input of said radio frequency amplifier;

control circuit means responsive to a signal indicative of the distortion generated due to the non-linearity of the input and output characteristics of the radio frequency amplifier and generating at least one control signal for controlling the distortion compensating means, said distortion compensating means further comprising: first divider means for dividing the input signal of the low-distortion radio-frequency amplifying apparatus into two output signals;

distortion generating amplifier means, coupled to said first divider means, for amplifying a first output signal of said two output signals and for adding a distortion component thereto to output an amplified first output signal;

linear amplifier means, coupled to said first divider means, receiving a second output signal of said two output signals via a first variable attenuator, for amplifying said second output signal of said two output signals without distortion to output an amplified second output signal;

second divider means coupled to said linear amplifier means, for dividing said amplified second output signal into first and second divided signals;

distortion extraction combiner means, receiving said amplified first output signal of said distortion generating amplifier means via a second variable attenuator and said first divided signal output of said second divider means, for combining said amplified first output signal and said first divided signal in opposite phases to output a distortion signal;

combiner means, receiving said distortion signal via a third variable attenuator and said second divided signal of said second divider via a fourth variable attenuator; and combiner means for combining said distortion signal and said second divided signal in opposite phases to output a combined signal including a distortion compensating component which cancels the distortion generated in the radio-frequency amplifier, said control means adjusting an amount of attenuation of each of said variable attenuators in accordance with the said signal indicative of the distortion.

2. The distortion compensating circuit of claim 1 wherein said signal indicative of the distortion comprises a baseband signal corresponding to an envelope detected output of said radio frequency amplifier.

3. The distortion compensating circuit of claim 1 wherein said signal indicative of the distortion comprises a signal proportional to average power input to said radio frequency amplifier.

4. A low-distortion radio frequency amplifying apparatus including a radio frequency amplifier, comprising:
mixer means, coupled to and mixing a portion of an input baseband signal corresponding to an envelope detection output of an input signal to said radio frequency amplifier and a local frequency signal, for generating a frequency conversion signal;
distortion compensating means, coupled to said mixer means, for correcting a radio-frequency distortion of said frequency conversion signal and for outputting a corrected signal for said radio frequency amplifier;
said radio-frequency amplifier being coupled to said distortion compensating means for amplifying corrected signal; and
control circuit means, coupled to a portion of said input baseband varying a distortion compensating characteristic of said distortion compensating means;
said distortion compensating means compensating distortion generated due to non-linearity of input and output characteristics of said radio-frequency amplifier and comprising:
first divider means for dividing the input signal of the low-distortion radio-frequency amplifying apparatus into two output signals;
distortion generating amplifier means, coupled to said first divider means, for amplifying a first output signal of said two output signals and for adding a distortion component thereto to output an amplified first output signal;
linear amplifier means, coupled to said first divider means, receiving a second output signal of said output signals via a first variable attenuator, for amplifying said second output signal of said two output signals without distortion to output an amplified second output signal;
second divider means coupled to said linear amplifier means, for dividing said amplified second output signal into first and second divided signals;
distortion extraction combiner means, receiving said amplified first output signal of said distortion generating amplifier means via a second variable attenuator and said first divided signal output of said second divider means, for combining said amplified first output signal and said divided signal in opposite phases to output a distortion signal;
combiner means, receiving said distortion signal via a third variable attenuator and said second divided signal of said second divider via a fourth variable attenuator; and
combiner means for combining said distortion signal and said second divided signal in opposite phases to output a combined signal including a distortion compensating component which cancels the distortion generated in the radio-frequency amplifier,
said control means adjusting an amount of attenuation of each of said variable attenuators in accordance with the said input baseband signal.

5. A low-distortion radio-frequency amplifying apparatus comprising:
distortion compensating means for compensating a distortion generated due to a non-linearity of input and output characteristics of a radio-frequency amplifier;
means for metering and genreating a signal proportional to the average power of the input of said radio-frequency amplifier; and
control means for varying the distortion compensating characteristic of said distortion compensating circuit in response to said signal proportional to average power;
said distorting compensating means further comprising:
first divider means for dividing the input signal of the low-distortion radio-frequency amplifying apparatus into two output signals;
distortion generating amplifier means, coupled to said first divider means, for amplifying a first output signal of said two output signals and for adding a distortion component thereto to output an amplified first output signal;
linear amplifier means, coupled to said first divider means, receiving a second output signal of said two output signals via a first variable attenuator, for amplifying said second output signal of said two output signals without distortion to output an amplified second output signal;
second divider means, coupled to said linear amplifier means, for dividing said amplified second output signal into first and second divided signals;
distortion extraction combiner means, receiving said amplified first output signal of said distortion generating amplifier means via a second variable attenuator and said first divided signal output of said second divider means, for combining said amplified first output signal and said first divided signal in opposite phases to output a distortion signal;
combiner means receiving said distortion signal via a third variable attenuator and said second divided signal of said second divider via a fourth variable attenuator; and
combiner means for combining said distortion signal and said second divided signal in opposite phases to output a combined signal including a distortion compensating component which cancels the distortion generated in the radio-frequency amplifier,
said control means adjusting an amount of attenuation of each of said variable attenuators in accordance with the average power measured by said metering and generating means.

6. A method of compensating distortion generated in a radio-frequency amplifier due to non-linearity input and output characteristics of the radio-frequency amplifier, comprising the steps of:
adding a distortion component to an input signal in distortion compensating means coupled to the radio-frequency amplifier to generate an output signal;
amplifying the output signal in the radio-frequency amplifier to generate an amplified output signal; and
varting distortion compensating characteristics of the distortion compensating means in response to a signal corresponding to the distortion generated in the radio-frequency amplifier, so that the second amplified output signal is a distortion free amplified signal; and wherein said step of adding a distortion component further comprises the steps of:
dividing the input signal, in the first dividing means, into first and second divided input signals;
amplifying the first divided input signal and adding a distortion component to the first divided input signal in distortion amplifier means, to generate a distorted input signal;

attenuating the second divided input signal in a first attenuating means, to generate a first attenuated signal;

amplifying the first attenuated signal in a first linear amplifier to generate a first amplified signal;

attenuating the distorted input signal in a second attenuation means, to generate an attenuated distorted input signal;

dividing the first amplified signal into first and second divided signals;

combining the attenuated distorted input signal and the first divided signal in opposite phases, in first combiner means, to generate a distorted component signal;

attenuating the distort component signal in third attenuating means to generate an attenuated distorted component signal;

attenuating the second divided signal in fourth attenuating means to generate an attenuated second divided signal;

combining the attenuated distorted component signal with the attenuated second divided signal in opposite phases, in second combiner means, to generate the output signal; and coupling said output signal to said radio-frequency amplifier.

7. The method of compensating distortion of claim 6, said step of varying distortion compensating characteristics comprising varying the attenuating means.

* * * * *